United States Patent
Miura et al.

(10) Patent No.: US 10,192,876 B2
(45) Date of Patent: Jan. 29, 2019

(54) TRANSISTOR, MEMORY, AND MANUFACTURING METHOD OF TRANSISTOR

(71) Applicant: Toshiba Memory Corporation, Minato-ku (JP)

(72) Inventors: Kentaro Miura, Kawasaki (JP); Tomomasa Ueda, Yokohama (JP); Keiji Ikeda, Kawasaki (JP); Nobuyoshi Saito, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/698,077

(22) Filed: Sep. 7, 2017

(65) Prior Publication Data
US 2018/0269217 A1 Sep. 20, 2018

(30) Foreign Application Priority Data
Mar. 17, 2017 (JP) .................................. 2017-053468

(51) Int. Cl.
| H01L 27/00 | (2006.01) |
|---|---|
| H01L 27/11524 | (2017.01) |
| H01L 27/12 | (2006.01) |
| H01L 29/786 | (2006.01) |

(52) U.S. Cl.
CPC .... *H01L 27/11524* (2013.01); *H01L 27/1225* (2013.01); *H01L 27/1259* (2013.01); *H01L 29/786* (2013.01)

(58) Field of Classification Search
CPC .............................................. H01L 27/11524
See application file for complete search history.

(56) References Cited

U.S. PATENT DOCUMENTS

| 2012/0273773 A1 | 11/2012 | Ieda et al. |
|---|---|---|
| 2014/0284593 A1 | 9/2014 | Nakano et al. |
| 2015/0084045 A1 | 3/2015 | Yamazaki et al. |
| 2015/0102317 A1 | 4/2015 | Kim |
| 2015/0108467 A1 | 4/2015 | Moriguchi et al. |
| 2016/0155828 A1* | 6/2016 | Sugawara ......... H01L 29/66969 438/104 |
| 2017/0141131 A1 | 5/2017 | Nakano et al. |

FOREIGN PATENT DOCUMENTS

| JP | 2013-008946 | 1/2013 |
|---|---|---|
| JP | 2015-088739 | 5/2015 |
| TW | 201501326 A | 1/2015 |
| WO | 2012/086513 | 6/2012 |
| WO | 2016/067585 | 5/2016 |
| WO | 2016/139828 | 9/2016 |

* cited by examiner

*Primary Examiner* — William Harriston
(74) *Attorney, Agent, or Firm* — Oblon, McClelland, Maier & Neustadt, L.L.P.

(57) ABSTRACT

According to one embodiment, a transistor includes: a gate electrode; a gate insulating layer provided on the gate electrode; an oxide semiconductor layer provided on the gate insulating layer; an oxygen supply layer provided on the oxide semiconductor layer; a first oxygen barrier layer provided on the oxygen supply layer; a source electrode provided to penetrate the oxygen supply layer and the first oxygen barrier layer and connected to the oxide semiconductor layer; and a drain electrode spaced apart from the source electrode, provided to penetrate the oxygen supply layer and the first oxygen barrier layer, and connected to the oxide semiconductor layer.

12 Claims, 6 Drawing Sheets

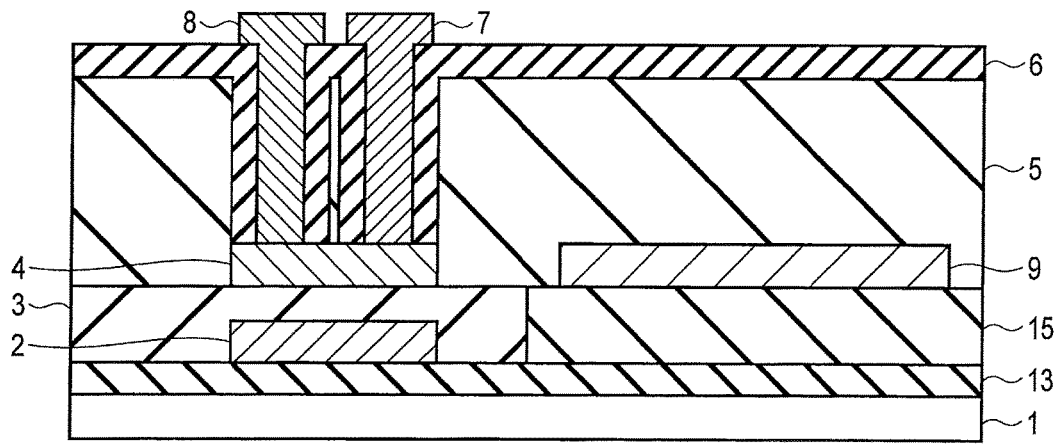
F I G. 5
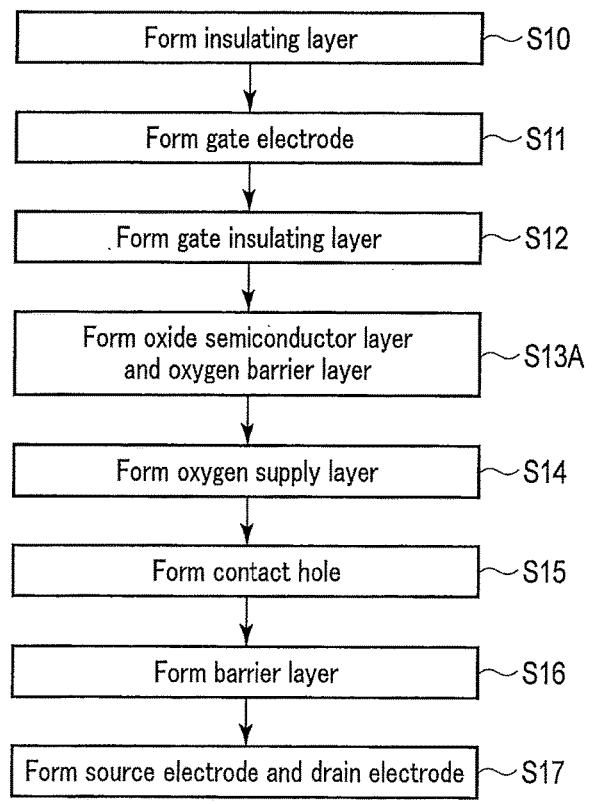
F I G. 6

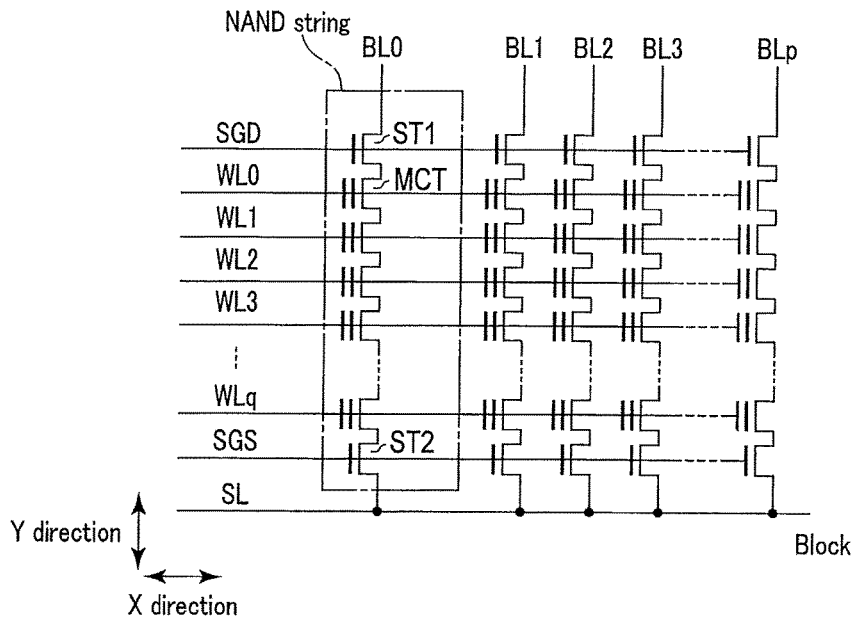
F I G. 9A
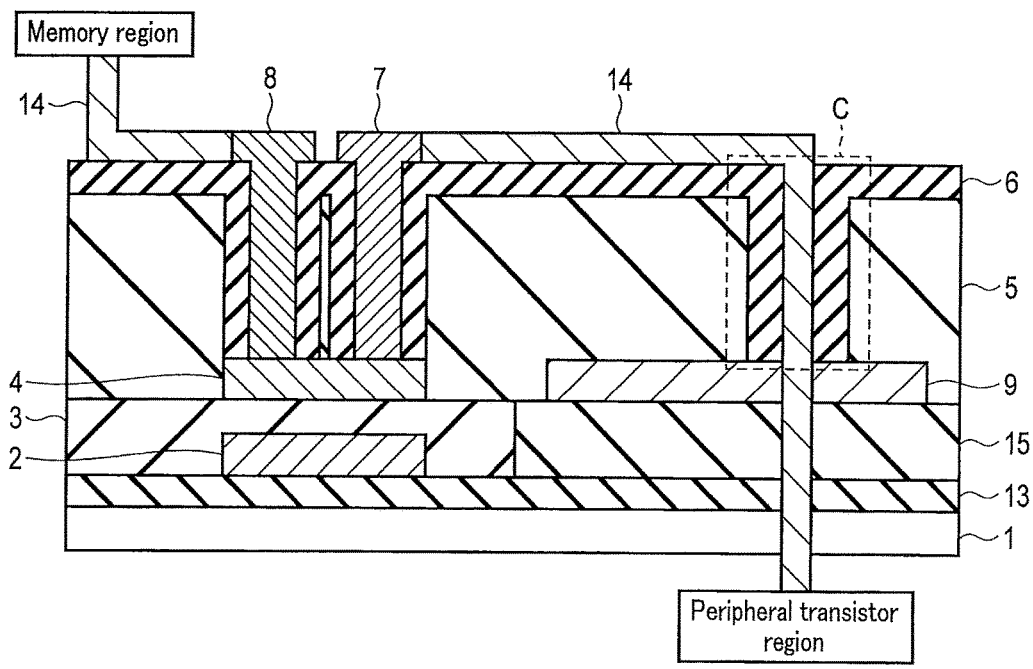
F I G. 9B

… (1)

TRANSISTOR, MEMORY, AND MANUFACTURING METHOD OF TRANSISTOR

CROSS-REFERENCE TO RELATED APPLICATIONS

This application is based upon and claims the benefit of priority from Japanese Patent Application No. 2017-053468, filed Mar. 17, 2017, the entire contents of which are incorporated herein by reference.

FIELD

Embodiments described herein relate generally to a transistor, a memory, and a manufacturing method of a transistor.

BACKGROUND

As semiconductor layer materials of next generation thin film transistors (TFTs), oxide semiconductors have attracted attention in recent years. Among them, TFTs using an amorphous oxide semiconductor such as In—Ga—Zn—O (hereinafter, referred to as InGaZnO) have attracted attention. Oxide semiconductor TFTs can be formed at a low temperature of 400° C. or lower and thus can be formed during interconnection process of an LSI. In addition, due to a very small leakage current and a high withstand voltage, oxide semiconductor TFTs attract attention as high-performance switches. However, in a heat treatment process such as hydrogen sintering performed in manufacturing a semiconductor device including oxide semiconductor TFTs, heat resistance of the oxide semiconductor TFT was low.

BRIEF DESCRIPTION OF THE DRAWINGS

FIG. 5 is a cross-sectional view of a transistor according to a third embodiment;
FIG. 6 is a view for illustrating a manufacturing method of a transistor according to a third embodiment;
FIG. 9A is a circuit diagram illustrating an example of a physical block included in a NAND type memory chip;
and
FIG. 9B is a cross-sectional view of the TFT according to the present embodiment and illustrates a connection relation between a memory and a peripheral transistor.

DETAILED DESCRIPTION

Figure 1:
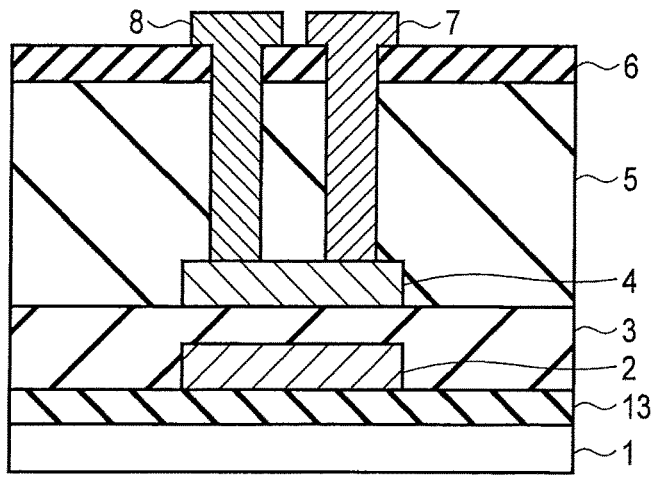
FIG. 1 is a cross-sectional view of a transistor according to a first embodiment.

In general, according to one embodiment, there is provided a transistor comprising:
a gate electrode;
a gate insulating layer provided on the gate electrode;
an oxide semiconductor layer provided on the gate insulating layer;
an oxygen supply layer provided on the oxide semiconductor layer;
a first oxygen barrier layer provided on the oxygen supply layer;
a source electrode provided to penetrate the oxygen supply layer and the first oxygen barrier layer and connected to the oxide semiconductor layer; and
a drain electrode spaced apart from the source electrode, provided to penetrate the oxygen supply layer and the first oxygen barrier layer, and connected to the oxide semiconductor layer.

Hereinafter, embodiments of the present invention will be described with reference to the drawings. Those with the same reference numerals indicate corresponding ones. Note that the drawings are schematic or conceptual, and the relationship between the thickness and the width of each portion, the ratio of the sizes between the portions, and the like are not necessarily the same as the actual ones. Also, even in the case of representing the same portion, the dimensions or ratios of the portions may be represented differently depending on the drawings.

The term "on" in this specification indicates a stacking direction of a laminate, and the terms "side surface" and "side" indicate a direction intersecting in the stacking direction. Typically, the intersecting direction may be a perpendicular direction, but is not necessarily limited thereto. On the other hand, a first direction indicates the stacking direction of the laminate, and a second direction indicates a direction perpendicular to the first direction. Note that the stacking direction typically corresponds to a direction in which two layers included in the laminate are connected to each other at a shortest distance. In addition, the term "perpendicular" does not represent "exactly perpendicular" only. For example, it may be substantially perpendicular as long as it includes variations in a manufacturing process and the like.

First Embodiment

FIG. 1 is a cross-sectional configuration diagram illustrating a TFT using oxide semiconductor according to an embodiment.

As illustrated in FIG. 1, a TFT according to a first embodiment includes an insulating layer 13 provided on a substrate 1, and a gate electrode 2 provided on the insulating layer 13. A gate insulating layer 3 is provided so as to cover the insulating layer 13 and the gate electrode 2. An oxide semiconductor layer 4 is provided on the gate insulating layer 3 over the gate electrode 2.

An oxygen supply layer 5 is provided so as to cover the top of the gate insulating layer 3 and the oxide semiconductor layer 4. A first oxygen barrier layer 6 is provided on the oxygen supply layer 5. A source electrode 8 and a drain electrode 7 penetrate from the oxide semiconductor layer 4 to the first oxygen barrier layer 6. The source electrode 8 and the drain electrode 7 are disposed not to be in contact with each other.

In addition, the TFT using oxide semiconductor according to an embodiment includes a substrate, a first oxygen barrier layer, an insulating layer provided between the substrate and the first oxygen barrier layer, a gate electrode provided between the insulating layer and the first oxygen barrier layer, a gate insulating layer provided between the gate electrode and the first oxygen barrier layer, an oxide semiconductor layer provided between the gate insulating layer and the first oxygen barrier layer and including a first portion and a second portion aligned with the first portion in a direction perpendicular to a first direction from the substrate to the barrier layer and electrically connected to the first portion, an oxygen supply layer provided between the oxide semiconductor layer and the first oxygen barrier layer, a source electrode electrically connected to the first portion, and a drain electrode electrically connected to the second portion, and it can be said that at least one of the source electrode and the drain electrode is thicker than the sum of a thicknesses of the first oxygen barrier layer and a thickness of the oxygen supply layer in the first direction.

The substrate 1 may use a material, such as glass, SiC, or plastic, which transmits visible light. In addition, a material, such as silicon or stainless steel, which does not transmit light, may be used.

The insulating layer 13 includes, for example, at least one of silicon oxide, silicon nitride, and silicon oxynitride. As the insulating layer 13, for example, a silicon oxide film or a silicon nitride film is used. As the insulating layer 13, for example, a laminated film including a silicon oxide film and a silicon nitride film may be used.

As the gate electrode 2, various conductive materials are used. For example, as the gate electrode 2, Al, Mo, Cu, Ti, W, alloys thereof, or laminated films thereof are used.

The gate insulating layer 3 includes, for example, at least one of silicon oxide, silicon nitride, and silicon oxynitride. As the gate insulating layer 3, for example, a laminated film including a silicon oxide film and a silicon nitride film may be used.

As the oxide semiconductor layer 4, for example, materials such as InGaZnO, InSnZnO, AlInZnO, AlInGaZnO, InGaSiO, ITO, InO, InGaO, ZnO, and AlZnO are used.

The oxygen supply layer 5 serves to supply oxygen when oxygen in the oxide semiconductor layer 4 is deficient. The oxygen supply layer 5 is, for example, silicon oxide, silicon nitride, or the like. The oxygen supply layer 5 may be an organic resin. It is also important that the oxygen supply layer 5 not only releases oxygen but also releases less hydrogen. Therefore, it is preferable to use a silicon oxide film rather than a silicon nitride film.

The first oxygen barrier layer 6 is provided so as to hold oxygen in the oxygen supply layer 5, and serves to prevent oxygen from diffusing above the first oxygen barrier layer 6. As the first oxygen barrier layer 6, for example, a metal oxide film is used. The first oxygen barrier layer 6 is, for example, an oxide film including at least one of Al and Mg.

In addition, the source electrode 8 and the drain electrode 7 include at least one of Cu, Ti, Al, Mo, Ta, W, alloys thereof, and laminated films thereof. As the source electrode 8 and the drain electrode 7, for example, a laminated film of Ti/Al/Ti, Mo/Al/Mo, or the like is used, and various conductive materials such as ITO may be used.

FIG. 1 illustrates a structure in which both the source electrode 8 and the drain electrode 7 penetrate to above the first oxygen barrier layer 6, but either of the source electrode 8 and the drain electrode 7 may penetrate to above the first oxygen barrier layer 6. In addition, the gate insulating layer 3 on the gate electrode 2 may use different insulators.

(Manufacturing Method)

A manufacturing method of a TFT according to a first embodiment will be described with reference to FIG. 2.

Figure 2:
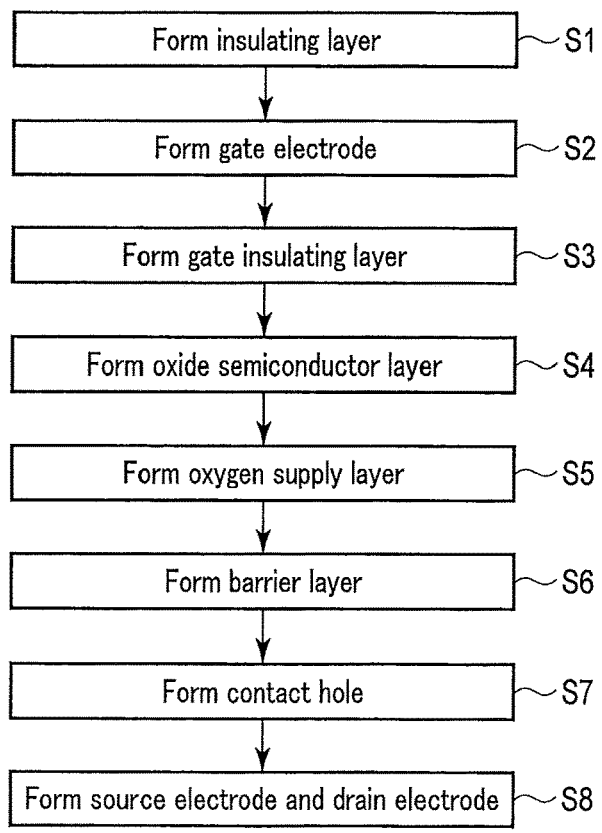
FIG. 2 is a view for illustrating a manufacturing method of a transistor according to a first embodiment.

FIG. 2 is a flowchart of the manufacturing method of the TFT according to the first embodiment.

After an insulating layer 13 is formed on a substrate 1 (S1 in FIG. 2), a metal film is formed and patterned on the insulating layer 13 by, for example, a sputtering method to thereby form a gate electrode 2 (S2 in FIG. 2).

The patterning of the gate electrode 2 is performed by using, for example, a wet etching method or a dry etching method such as reactive ion etching (RIE). Thereby, the gate electrode 2 is processed to have a predetermined shape. The gate electrode 2 may be electrically connected to the substrate 1 or another layer by an interconnection which can be formed at the same time.

Subsequently, a gate insulating layer 3 is formed by, for example, an ALD method, a CVD method, a sputtering method, and a coating/firing process, so as to cover the gate electrode 2 and the substrate 1 (S3 in FIG. 2).

A film thickness of the gate insulating layer 3 is about 5 nm to 100 nm.

An oxide semiconductor layer 4 is formed on the gate insulating layer 3 (S4 in FIG. 2).

The forming of the oxide semiconductor layer 4 is performed by using, for example, an ALD method, a CVD method, a sputtering method, and a coating/firing process. In the case of the sputtering method, it is desirable to introduce $O_2$ gas as well as Ar atmosphere and sufficiently perform oxidation thereon.

A film thickness of the oxide semiconductor layer 4 is about 5 nm to 100 nm. Preferably, the film thickness of the oxide semiconductor layer 4 is about 20 nm.

The patterning of the oxide semiconductor layer 4 is performed by, for example, a wet etching method or a dry etching method such as RIE. Thereby, the oxide semiconductor layer 4 is processed to have a predetermined shape (for example, a rectangular parallelepiped shape).

For example, an ALD method, a CVD method, a sputtering method, and a coating/firing process are used for forming an oxygen supply layer 5 disposed on the oxide semiconductor layer 4 (S5 in FIG. 2).

A film thickness of the oxygen supply layer 5 is about 20 nm to 300 nm. In order to supply a sufficient amount of oxygen, it is preferable that the film thickness of the oxygen supply layer 5 is greater than that of the oxide semiconductor layer 4.

A first oxygen barrier layer 6 disposed on the oxygen supply layer 5 is formed by using, for example, an oxygen plasma method of the ALD method. In addition, the first oxygen barrier layer 6 may be formed by an ALD method of $H_2O$ or $O_3$ plasma, or may be formed by forming Al by a vapor deposition or sputtering method and performing annealing thereon in oxygen plasma or oxygen atmosphere (S6 in FIG. 2).

A film thickness of the first oxygen barrier layer 6 is, for example, 3 nm. If the film thickness of the first oxygen barrier layer 6 is too thin, the oxygen barrier performance thereof is degraded, and if too thick, it is difficult to form a contact hole. When the film thickness of the first oxygen barrier layer 6 is about 2 nm to 3 nm, oxygen barrier properties are exhibited, so it is desirable to form the first oxygen barrier layer 6 to a thickness of about 2 nm to 5 nm.

After the forming of the oxygen supply layer 5 and the first oxygen barrier layer 6, for example, a contact hole having a predetermined shape is formed by a wet etching method, or a dry etching method such as RIE, ion milling (S7 in FIG. 2). The oxide semiconductor layer 4 is exposed by the contact hole.

A metal film is formed and patterned in the inside of the formed contact hole and on the first oxygen barrier layer 6 by using, for example, an ALD method, a CVD method, or a sputtering method. In this manner, a source electrode 8 and a drain electrode 7 are formed (S8 in FIG. 2).

The patterning of the source electrode 8 and the drain electrode 7 is performed by using, for example, a wet etching method or a dry etching method.

The TFT according to the first embodiment is manufactured by the above-described manufacturing method.

In performing a heat treatment process, such as hydrogen sintering, which is necessary for manufacturing a semiconductor device including an oxide semiconductor TFT, there is a problem that oxygen deficiency occurs in the oxide semiconductor layer 4 and a threshold voltage is shifted in a negative direction. This problem can be solved by supplying oxygen to a channel of the oxide semiconductor layer 4 at the time of heating. However, although the oxygen supply layer 5 has a function of releasing oxygen at the time of annealing, oxygen diffuses upward and oxygen is absorbed in the source electrode 8 or the drain electrode 7. Thus, the supply of oxygen to the oxide semiconductor layer 4 becomes insufficient. In the TFT according to the first embodiment, the source electrode 8 and the drain electrode 7 other than the contact hole are disposed on the first oxygen barrier layer 6. The first oxygen barrier layer 6 suppresses oxygen diffusion to the upper side and also suppresses the source electrode 8 and the drain electrode 7 from absorbing oxygen outside the contact hole. Therefore, oxygen is efficiently supplied to the channel of the oxide semiconductor layer 4 during the heat treatment process, resulting in an improvement in the heat resistance of the TFT.

Second Embodiment

Figure 3:
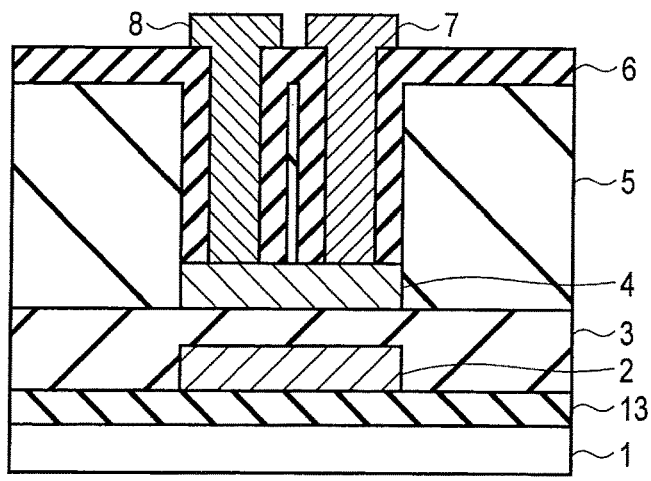
FIG. 3 is a cross-sectional view of a transistor according to a second embodiment.

FIG. 3 is a schematic diagram for illustrating a second embodiment and is a cross-sectional configuration diagram of a TFT using oxide semiconductor.

In the present embodiment, descriptions about constituent elements common to the first embodiment will be omitted.

A configuration of a TFT according to a second embodiment will be described with reference to FIG. 3.

The TFT of the first embodiment as illustrated in FIG. 1 has a structure in which the oxygen supply layer 5 is in contact with the source electrode 8 and the drain electrode 7 on the side of the contact hole. On the other hand, in the TFT of the second embodiment as illustrated in FIG. 3, first oxygen barrier layers 6 are provided between an oxygen supply layer 5 and a source electrode 8 and between the oxygen supply layer 5 and a drain electrode 7 on the side of the source electrode 8 and the drain electrode 7 or in a second direction of the source electrode 8 and the drain electrode 7. That is, the TFT of the second embodiment has a structure in which the first oxygen barrier layers 6 are in contact with each other on the side of the contact hole.

(Manufacturing Method)

A manufacturing method of a TFT according to a second embodiment will be described with reference to FIG. 4.

Figure 4:
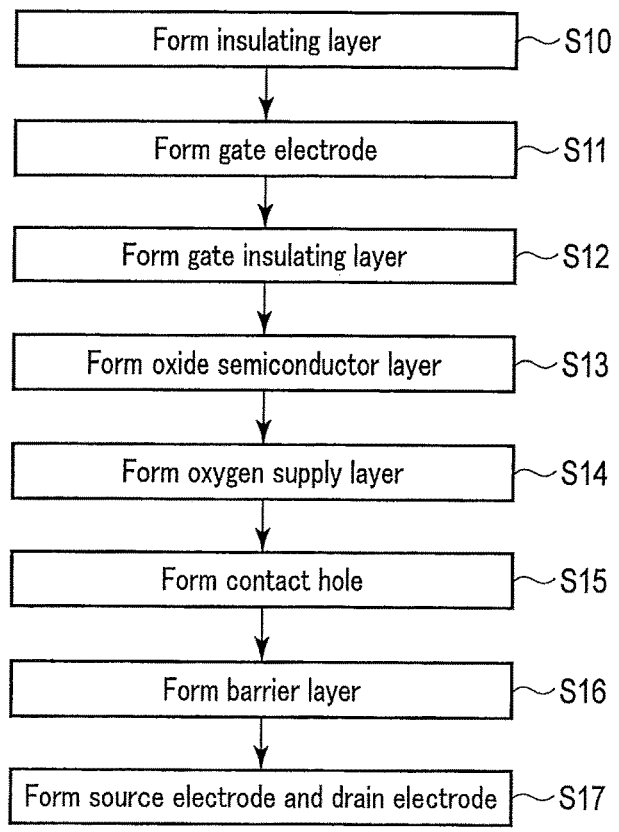
FIG. 4 is a view for illustrating a manufacturing method of a transistor according to a second embodiment.

FIG. 4 is a flowchart of the manufacturing method of the TFT according to the second embodiment.

After an insulating layer 13 is formed on a substrate 1 (S10 in FIG. 4), a metal film is formed and patterned on the insulating layer 13 by, for example, a sputtering method to thereby form a gate electrode 2 (S11 in FIG. 4).

For patterning the gate electrode 2, for example, a wet etching method or a dry etching method such as RIE is used. Thereby, the gate electrode 2 is processed to have a predetermined shape (for example, a rectangular parallelepiped shape). The gate electrode 2 may be electrically connected to the substrate 1 or another layer by an interconnection which can be formed at the same time.

Subsequently, a gate insulating layer 3 is formed by, for example, an ALD method, a CVD method, a sputtering method, and a coating/firing process, so as to cover the top of the insulating layer 13 and the gate electrode 2 (S12 in FIG. 4).

A film thickness of the gate insulating layer 3 is about 5 nm to 100 nm.

An oxide semiconductor layer 4 is formed on the gate insulating layer 3 (S13 in FIG. 4). The forming of the oxide semiconductor layer 4 is performed by using, for example, an ALD method, a CVD method, a sputtering method, and a coating/firing process. In the case of the sputtering method, it is desirable to introduce $O_2$ gas as well as Ar atmosphere and sufficiently perform oxidation thereon.

A film thickness of the oxide semiconductor layer 4 is about 5 nm to 100 nm. Preferably, the film thickness of the oxide semiconductor layer 4 is about 20 nm.

The patterning of the oxide semiconductor layer 4 is performed by, for example, a wet etching method or a dry etching method such as RIE. Thereby, the oxide semiconductor layer 4 is processed to have a predetermined shape (for example, a rectangular parallelepiped shape).

For example, an ALD method, a CVD method, a sputtering method, and a coating/firing process are used for forming the oxygen supply layer 5 disposed to cover the top of the gate insulating layer 3 and the oxide semiconductor layer 4 (S14 in FIG. 4).

A film thickness of the oxygen supply layer 5 is about 20 nm to 300 nm.

After the forming of the oxygen supply layer 5, a contact hole is formed (S15 in FIG. 4). The top of the oxide semiconductor layer 4 and the side of the oxygen supply layer 5 are newly exposed by the contact hole.

After that, a first oxygen barrier layer 6 is formed (S16 in FIG. 4). First, a thin alumina film having a thickness of about 3 nm is formed on the entire surface by an ALD method. Subsequently, a SiO, SiN, SiON, or alumina film is formed with an angle by a sputtering method. At this time, the first oxygen barrier layer 6 on the oxide semiconductor layer 4 exposed by the contact hole can be made thinner than the first oxygen barrier layer 6 formed on the top of the oxygen supply layer 5 and the side of the oxygen supply layer 5.

After that, the oxide semiconductor layer 4 is exposed again by removing the thin first oxygen barrier layer 6 on the oxide semiconductor layer 4 by, for example, an RIE method. Since the first oxygen barrier layer 6 formed on the top of the oxygen supply layer 5 and the side of the contact hole is formed to be thicker than the first oxygen barrier layer 6 on the oxide semiconductor layer 4, it remains without being removed even if RIE is performed. The first oxygen barrier layer 6 formed on the side may be partly opened by this etching, but the oxygen barrier effect is sufficiently exhibited as compared with a structure which does not completely cover the side.

The forming of the first oxygen barrier layer 6 disposed on the oxygen supply layer 5 is performed by using, for example, an oxygen plasma method of the ALD method. A film thickness of the first oxygen barrier layer 6 is, for example, 3 nm.

A metal film is formed and patterned in the inside of the formed contact hole and on the first oxygen barrier layer 6 by using, for example, an ALD method, a CVD method, or a sputtering method. In this manner, a source electrode 8 and a drain electrode 7 are formed (S17 in FIG. 4).

The patterning of the source electrode 8 and the drain electrode 7 is performed by using, for example, a wet etching method or a dry etching method.

The TFT according to the second embodiment is manufactured by the above-described processes.

The TFT of the second embodiment has a heat resistance effect similar to the TFT of the first embodiment. In addition, oxygen that is absorbed by the source electrode 8 and the drain electrode 7 can be more suppressed by further including the first oxygen barrier layer 6 on the side of the oxygen supply layer 5 in the contact hole. As a result, it is possible to realize a transistor having a resistance to heat treatment such as sintering.

Third Embodiment

FIG. 5 is a schematic diagram for illustrating a third embodiment and is a cross-sectional configuration diagram of a TFT using oxide semiconductor.

In the present embodiment, descriptions about constituent elements common to the first embodiment and the second element are made as appropriate.

The TFT of the third embodiment as illustrated in FIG. 5 includes an interlayer insulating layer 15 adjacent to a gate insulating layer 3 in a direction intersecting with an insulating layer 13 in a first direction. Parts above the gate insulating layer 3 in the TFT of the third embodiment are the same as those in the TFT of the second embodiment. A second oxygen barrier layer 9 is provided on the interlayer insulating layer 15, and an oxygen supply layer 5 is provided on the second oxygen barrier layer 9. A first oxygen barrier layer 6 is provided on the oxygen supply layer 5. In addition, the second oxygen barrier layer 9 on the interlayer insulating layer 15 and an oxide semiconductor layer 4 on the gate insulating layer 3 are spaced apart from each other.

The second oxygen barrier layer 9 serves to prevent oxygen included in the oxygen supply layer 5 from diffusing downward.

The second oxygen barrier layer 9 includes the same material as the oxide semiconductor layer 4. For example, the second oxygen barrier layer 9 includes IGZO, ITZO, or AlInZnO. Therefore, the second oxygen barrier layer 9 can be formed without adding a process such as photolithography.

Regardless of the example of FIG. 5, for example, the second oxygen barrier layer 9 and the oxide semiconductor layer 4 may be in contact with each other without a gap therebetween. Specifically, in order to prevent the influence of interconnection delay due to cross capacitance, the second oxygen barrier layer 9 may not be provided in a region covered with the gate electrode 2, the source electrode 8, and the drain electrode 7.

Regardless of the example of FIG. 5, the second oxygen barrier layer 9 may be provided in the TFT of the first embodiment.

(Manufacturing Method)

A manufacturing method of a TFT according to a third embodiment will be described with reference to FIG. 6.

FIG. 6 is a flowchart of the manufacturing method of the TFT according to the third embodiment.

Processes different from those in the second embodiment will be described.

An oxide semiconductor layer 4 is formed on a gate insulating layer 3. The forming of the oxide semiconductor layer 4 is performed by using, for example, an ALD method, a CVD method, a sputtering method, and a coating/firing process. In the case of the sputtering method, it is desirable to introduce $O_2$ gas as well as Ar atmosphere and sufficiently perform oxidation thereon.

A film thickness of the oxide semiconductor layer 4 is about 5 nm to 100 nm. Preferably, the film thickness of the oxide semiconductor layer 4 is about 20 nm.

The patterning of the oxide semiconductor layer 4 and the patterning of a second oxygen barrier layer 9 can be simultaneously performed by, for example, a wet etching method or a dry etching method such as RIE. The second oxygen barrier layer 9 can be formed without any additional process (S13A in FIG. 6).

The other processes are the same as those in FIG. 4.

The TFT according to the third embodiment is manufactured by the above-described processes.

The TFT of the third embodiment has a heat resistance effect similar to the TFT of the second embodiment. In addition, downward diffusion of oxygen can be prevented by providing the second oxygen barrier layer 9. Therefore, the oxygen supply layer 5 maintains an appropriate oxygen content and can supply oxygen immediately even if oxygen in the oxide semiconductor layer 4 is deficient.

Fourth Embodiment

Figure 7A:
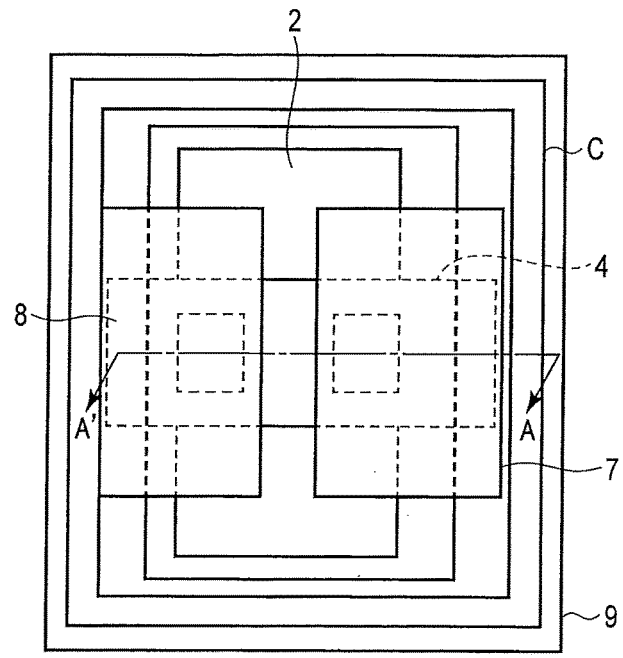
FIG. 7A is a top view of a transistor according to a fourth embodiment.
Figure 7B:
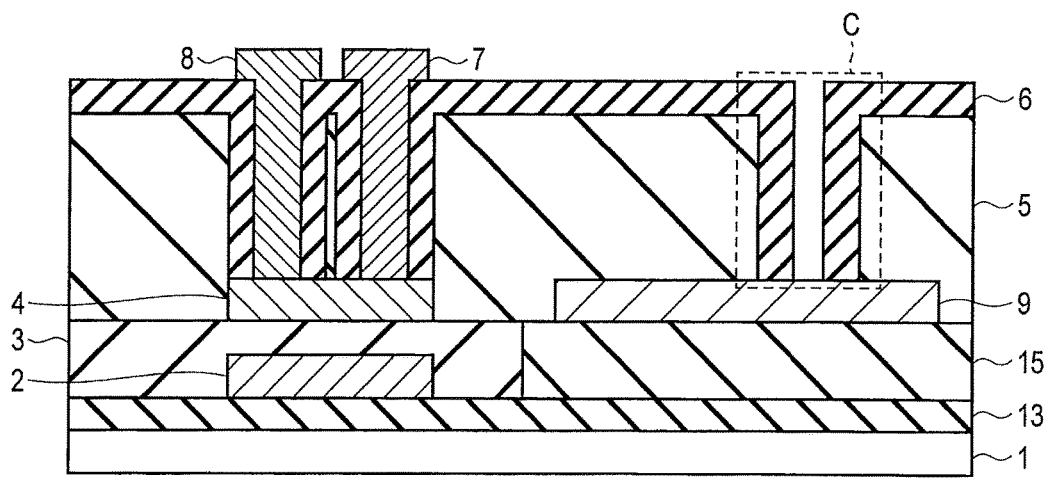
FIG. 7B is a A-A' cross-sectional view of a transistor according to a fourth embodiment.

FIG. 7A is a top view for illustrating the TFT of the fourth embodiment, and FIG. 7B is an A-A' cross-sectional view of the TFT.

In the present embodiment, descriptions about constituent elements common to the first embodiment, the second embodiment, and the third embodiment will be omitted.

The transistor according to the fourth embodiment has a side portion C in the transistor according to the third embodiment.

As illustrated in FIG. 7A, the transistor according to the third embodiment is surrounded by the side portion C. The side portion C represents, for example, a portion provided on the side surface of the oxygen supply layer 5. Diffusion of oxygen in the oxygen supply layer 5 can be prevented by providing the side portion C.

In the TFT of the fourth embodiment as illustrated in FIG. 7B, a side portion C where a second oxygen barrier layer 9 is exposed is provided in the TFT of the third embodiment, and a first oxygen barrier layer 6 is provided on the side of the side portion C. As illustrated in FIG. 7B, the side portion C is provided on the second oxygen barrier layer 9.

Since the side portion C is provided so as to prevent diffusion of oxygen in a direction along the top of the oxide semiconductor layer 4, the side portion C may not be provided on the second oxygen barrier layer 9 and may be provided on a gate insulating layer 3.

Regardless of the example of FIG. 7B, the first oxygen barrier layer 6 may not be provided on the side of a contact hole. In addition, the second oxygen barrier layer 9 may not be provided.

(Manufacturing Method)

A manufacturing method of a TFT according to a fourth embodiment will be described with reference to FIG. 8.

Figure 8:
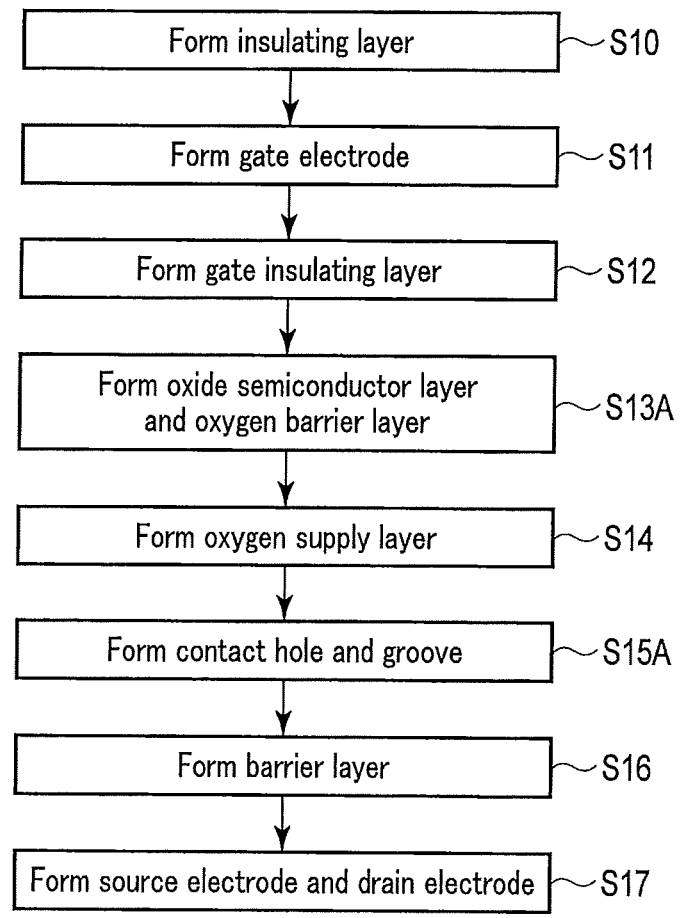
FIG. 8 is a view for illustrating a manufacturing method of a transistor according to a fourth embodiment.

FIG. 8 is a flowchart of the manufacturing method of the TFT according to the fourth embodiment.

Processes different from those in the third embodiment will be described.

After the forming of an oxygen supply layer 5, a side portion C is formed simultaneously with a contact hole in a step of forming a contact hole (S15A in FIG. 8).

The top of the oxide semiconductor layer 4, the top of the second oxygen barrier layer 9, and the side of the oxygen supply layer 5 are newly exposed by the contact hole and the side portion C.

The other processes are the same as those in FIG. 6.

The TFT according to the fourth embodiment is manufactured by the above-described processes.

The TFT of the fourth embodiment has a heat resistance effect similar to the third embodiment, and can prevent oxygen from diffusing downward by providing the second oxygen barrier layer 9. Further, lateral diffusion of oxygen can be prevented by providing the side portion C.

The side portion C may be formed to surround a TFT region, or may be formed around a boundary with a material which is particularly easy to absorb oxygen, such as an interconnection region. Due to the effect of the side portion C, a variation in a concentration of oxygen diffusing into the oxygen supply layer 5 in the TFT region is suppressed, and a variation in characteristics of the TFT is suppressed.

Application Example

The TFT of the present embodiment can be mounted on a NAND type memory.

FIG. 9A is a circuit diagram illustrating a configuration example of a physical block included in a NAND type memory chip. Each physical block includes (p+1) NAND strings arranged in order along an X direction (p is an integer of 0 or more). A select transistor ST1 included in each NAND string has a drain connected to a bit line BL0-BLp, and a gate commonly connected to a select gate line SGD. As the select transistor ST1, the TFT of the present embodiment can be used. In addition, a select transistor ST2 has a source commonly connected to a source line SL, and a gate commonly connected to a select gate line SGS. The TFT of the present embodiment can also be used for the select transistor ST2.

Each memory cell transistor MCT (also referred to as a memory cell) is configured by a metal oxide semiconductor field effect transistor (MOSFET) having a stacked gate structure formed on a semiconductor substrate. The stacked gate structure includes a charge storage layer (floating gate electrode) formed on a semiconductor substrate with a gate insulating film interposed therebetween, and a control gate electrode formed on the charge storage layer with an inter-gate insulating film interposed therebetween. In the memory cell transistor MCT, a threshold voltage changes according to the number of electrons stored in the floating gate electrode, and data is stored according to a difference in the threshold voltage. The memory cell transistor MCT may be configured to store 1 bit, or may be configured to store multiple values (data of 2 bits or more).

In addition, the memory cell transistor MCT is not limited to the structure having the floating gate electrode, and may have a structure that can adjust a threshold voltage by trapping electrons at a nitride film interface as a charge storage layer, like a metal-oxide-nitride-oxide-silicon (MONOS) type. Similarly, the memory cell transistor MCT having the MONOS structure may be configured to store 1 bit, or may be configured to store multiple values (data of 2 or more bits).

In each NAND string, (q+1) memory cell transistors MCT are arranged between the source of the select transistor ST1 and the drain of the select transistor ST2, so that the respective current paths are connected in series. That is, the memory cell transistors MCT are connected in series in the Y direction in such a manner that adjacent memory cell transistors MCT share a diffusion region (source regions or drain region).

In each NAND string, the control gate electrodes are connected to word lines WL0 to WLq in order from the memory cell transistors MCT disposed closest to the drain side. Therefore, the drain of the memory cell transistor MCT connected to the word line WL0 is connected to the source of the select transistor ST1, and the source of the memory cell transistor MCT connected to the word line WLq is connected to the drain of the select transistor ST2.

The word lines WL0 to WLq commonly connect the control gate electrodes of the memory cell transistors MCT between the NAND strings in the physical block. That is, the control gate electrodes of the memory cell transistors MCT in the same row within the block are connected to the same word line WL. The (p+1) memory cell transistors MCT connected to the same word line WL are treated as one page (physical page), and data write and data read are performed for each physical page.

Further, the bit lines BL0 to BLp commonly connect the drains of the select transistors ST1 between the blocks. That is, the NAND strings in the same column within the blocks are connected to the same bit line BL.

FIG. 9B is a cross-sectional view of the TFT according to the present embodiment and illustrates a connection relation between a memory and a peripheral transistor.

The TFT according to the third embodiment includes a memory region, a peripheral transistor region, an interconnection 14 connecting a drain electrode 7 and the memory region, and an interconnection 14 connecting a source electrode 8 and the peripheral transistor region.

The interconnection 14 connecting the source electrode 8 and the peripheral transistor region passes through the side surface of the side portion C, passes through a substrate 1, a gate insulating film 3, a the second oxygen barrier layer 9, and is connected to a peripheral transistor.

As illustrated in FIG. 9A, when the TFTs (the select transistor ST1 and the select transistor ST2) are mounted in the memory of the NAND type memory chip, the TFT region and the interconnection are arranged close to each other. However, since a metal used as an interconnection material absorbs oxygen in the TFT region, a variation in characteristics within the TFTs has become a problem. This causes a problem that absorbs oxygen in the TFTs. As a countermeasure for this, the TFT region and the interconnection has been separated from each other to some extent. On the other hand, as illustrated in FIG. 9B, when the TFT of the present embodiment is used, it is possible to reduce an area of a peripheral circuit occupying the chip, resulting in a cost reduction of the chip. By forming the side portion C between the TFT region and the interconnection, the concentration distribution of oxygen in the TFT region is made uniform, and a variation in a threshold voltage which generates during annealing or the like can be suppressed.

Further, the TFT according to the present embodiment is applicable to not only a memory but also a logic circuit, a power supply, a high frequency circuit, an image sensor, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A transistor comprising:
   a gate electrode;

a gate insulating layer provided on the gate electrode;
an oxide semiconductor layer provided on the gate insulating layer;
an oxygen supply layer provided on the oxide semiconductor layer;
a first oxygen barrier layer including a first portion, the first portion provided on the oxygen supply layer;
a source electrode provided to include a source extending portion that extends through the oxygen supply layer and the first portion in a stacking direction of the layers, and connected to the oxide semiconductor layer; and
a drain electrode spaced apart from the source electrode, provided to include a drain extending portion that extends through the oxygen supply layer and the first portion in the stacking direction, and connected to the oxide semiconductor layer,
wherein the first oxygen barrier layer further includes a second portion between the oxygen supply layer and a side of the source extending portion, and a third portion between the oxygen supply layer and a side of the drain extending portion.

2. A transistor comprising:
a gate electrode;
a gate insulating layer provided on the gate electrode;
an oxide semiconductor layer provided on the gate insulating layer;
an oxygen supply layer provided on the oxide semiconductor layer;
a first oxygen barrier layer provided on the oxygen supply layer;
a source electrode provided to extend through the oxygen supply layer and the first oxygen barrier layer and connected to the oxide semiconductor layer;
a drain electrode spaced apart from the source electrode, provided to extend through the oxygen supply layer and the first oxygen barrier layer, and connected to the oxide semiconductor layer;
an interlayer insulating layer adjacent to the gate insulating layer in a direction intersecting with a first direction from the gate electrode to the first oxygen barrier layer; and
a second oxygen barrier layer provided on the interlayer insulating layer,
wherein the oxygen supply layer and the first oxygen barrier layer are further provided on the second oxygen barrier layer.

3. The transistor of claim 2, wherein a material of the second oxygen barrier layer is the same as a material of the oxide semiconductor layer.

4. The transistor of claim 2, wherein, above the interlayer insulating layer, the first oxygen barrier layer is further provided on a side of the oxygen supply layer.

5. A memory comprising:
the transistor of claim 4; and
a memory cell electrically connected to the transistor.

6. A transistor comprising:
a first oxygen barrier layer;
a gate electrode;
a gate insulating layer provided between the gate electrode and the first oxygen barrier layer;
an oxide semiconductor layer comprising a first portion and a second portion, the first portion being provided between the gate insulating layer and the first oxygen barrier layer, the second portion being aligned with the first portion in a direction intersecting with a first direction from the gate electrode to the first oxygen barrier layer;
an oxygen supply layer provided between the oxide semiconductor layer and the first oxygen barrier layer;
a source electrode electrically connected to the first portion; and
a drain electrode electrically connected to the second portion,
wherein a thickness of at least one of the source electrode and the drain electrode in the first direction is greater than the sum of a thickness of the first oxygen barrier layer and a thickness of the oxygen supply layer in the first direction.

7. The transistor of claim 6, further comprising:
an interlayer insulating layer adjacent to the gate insulating layer in the direction intersecting with the first direction; and
a second oxygen barrier layer provided on the interlayer insulating layer,
wherein the oxygen supply layer and the first oxygen barrier layer are further provided on the second oxygen barrier layer.

8. The transistor of claim 7, wherein a material of the second oxygen barrier layer is the same as a material of the oxide semiconductor layer.

9. The transistor of claim 7, wherein, above the interlayer insulating layer, the first oxygen barrier layer is further provided on a side of the oxygen supply layer.

10. A memory comprising:
the transistor of claim 9; and
a memory cell electrically connected to the transistor.

11. The transistor of claim 6, wherein the first oxygen barrier layer is further provided between the oxygen supply layer and the source electrode and between the oxygen supply layer and the drain electrode.

12. A manufacturing method of a transistor, comprising:
forming an insulating layer;
forming a conductive layer on the insulating layer;
patterning the conductive layer to form a gate electrode;
forming a gate insulating layer on the gate electrode;
forming an oxide semiconductor layer on the gate insulating layer;
patterning the oxide semiconductor layer;
forming an oxygen supply layer on the oxide semiconductor layer;
forming first and second contact holes in the oxygen supply layer,
forming a first oxygen barrier on the top of the oxygen supply layer and sides of the first and second contact holes in the oxygen supply layer; and
forming a source electrode and a drain electrode in the first and second contact holes, respectively.

* * * * *